(12) United States Patent
Lindemann et al.

(10) Patent No.: US 11,228,840 B2
(45) Date of Patent: Jan. 18, 2022

(54) SURFACE SPEAKER

(71) Applicant: Cirrus Logic International Semiconductor Ltd., Edinburgh (GB)

(72) Inventors: Eric Lindemann, Boulder, CO (US); Itisha Tyagi, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/040,853

(22) Filed: Jul. 20, 2018

(65) Prior Publication Data
US 2019/0028807 A1 Jan. 24, 2019

Related U.S. Application Data

(60) Provisional application No. 62/535,400, filed on Jul. 21, 2017.

(51) Int. Cl.
H04R 7/04 (2006.01)

(52) U.S. Cl.
CPC ......... *H04R 7/045* (2013.01); *H04R 2440/05* (2013.01); *H04R 2499/15* (2013.01)

(58) Field of Classification Search
CPC .. H04R 7/045; H04R 1/24; H04R 1/26; H01L 41/044; H01L 41/0471; H01L 41/042; H01L 41/0472; H01L 41/0474; B06B 1/0276; B06B 1/0696; B06B 1/0692
See application file for complete search history.

(56) References Cited

U.S. PATENT DOCUMENTS

| 3,686,927 | A | * | 8/1972 | Scharton | ................ | G01M 7/04 |
| | | | | | | 73/665 |
| 4,902,136 | A | | 2/1990 | Mueller et al. | | |
| 5,684,722 | A | | 11/1997 | Thorner et al. | | |
| 5,748,578 | A | | 5/1998 | Schell | | |
| 5,857,986 | A | | 1/1999 | Moriyasu | | |
| 6,050,393 | A | | 4/2000 | Murai et al. | | |
| 6,278,790 | B1 | * | 8/2001 | Davis | ....................... | H04R 7/04 |
| | | | | | | 310/324 |

(Continued)

FOREIGN PATENT DOCUMENTS

| AU | 2002347829 | 4/2003 |
| CN | 103165328 A | 6/2013 |

(Continued)

OTHER PUBLICATIONS

International Search Report and Written Opinion of the International Searching Authority, International Application No. PCT/GB2019/050964, dated Sep. 3, 2019.

(Continued)

*Primary Examiner* — Fan S Tsang
*Assistant Examiner* — Angelica M McKinney
(74) *Attorney, Agent, or Firm* — Jackson Walker L.L.P.

(57) ABSTRACT

Embodiments described herein provide an audio device and a method of operating the audio device. The audio device comprises at least one surface, a first surface transducer positioned to excite first modes of oscillation in a first surface of the at least one surface, and a second surface transducer positioned to excite second modes of oscillation in a second surface of the at least one surface, wherein the first modes of oscillation are of a higher frequency than the second modes of oscillation.

11 Claims, 6 Drawing Sheets

(56) References Cited

U.S. PATENT DOCUMENTS

| | | | |
|---|---|---|---|
| 6,332,029 B1 * | 12/2001 | Azima | B42D 15/022 381/152 |
| 6,388,520 B2 | 5/2002 | Wada et al. | |
| 6,567,478 B2 | 5/2003 | Oishi et al. | |
| 6,580,796 B1 | 6/2003 | Kuroki | |
| 6,683,437 B2 | 1/2004 | Tierling | |
| 6,703,550 B2 | 3/2004 | Chu | |
| 6,762,745 B1 | 7/2004 | Braun et al. | |
| 6,768,779 B1 | 7/2004 | Nielsen | |
| 6,784,740 B1 | 8/2004 | Tabatabaei | |
| 6,906,697 B2 | 6/2005 | Rosenberg | |
| 7,154,470 B2 | 12/2006 | Tierling | |
| 7,277,678 B2 | 10/2007 | Rozenblit et al. | |
| 7,333,604 B2 | 2/2008 | Zernovizky et al. | |
| 7,392,066 B2 | 6/2008 | Haparnas | |
| 7,456,688 B2 | 11/2008 | Okazaki et al. | |
| 7,623,114 B2 | 11/2009 | Rank | |
| 7,639,232 B2 | 12/2009 | Grant et al. | |
| 7,791,588 B2 | 9/2010 | Tierling et al. | |
| 7,979,146 B2 | 7/2011 | Ullrich et al. | |
| 8,068,025 B2 | 11/2011 | Devenyi et al. | |
| 8,098,234 B2 | 1/2012 | Lacroix et al. | |
| 8,102,364 B2 | 1/2012 | Tierling | |
| 8,325,144 B1 | 12/2012 | Tierling et al. | |
| 8,427,286 B2 | 4/2013 | Grant et al. | |
| 8,441,444 B2 | 5/2013 | Moore et al. | |
| 8,466,778 B2 * | 6/2013 | Hwang | B06B 1/045 340/407.1 |
| 8,480,240 B2 * | 7/2013 | Kashiyama | H04N 5/2171 359/507 |
| 8,572,293 B2 | 10/2013 | Cruz-Hernandez et al. | |
| 8,572,296 B2 | 10/2013 | Shasha et al. | |
| 8,593,269 B2 | 11/2013 | Grant et al. | |
| 8,648,829 B2 | 2/2014 | Shahoian et al. | |
| 8,659,208 B1 | 2/2014 | Rose et al. | |
| 8,947,216 B2 | 2/2015 | Da Costa et al. | |
| 8,981,915 B2 | 3/2015 | Birnbaum et al. | |
| 8,994,518 B2 | 3/2015 | Gregorio et al. | |
| 9,030,428 B2 | 5/2015 | Fleming | |
| 9,063,570 B2 | 6/2015 | Weddle et al. | |
| 9,083,821 B2 | 7/2015 | Hughes | |
| 9,092,059 B2 | 7/2015 | Bhatia | |
| 9,117,347 B2 | 8/2015 | Matthews | |
| 9,128,523 B2 | 9/2015 | Buuck et al. | |
| 9,164,587 B2 | 10/2015 | Da Costa et al. | |
| 9,196,135 B2 | 11/2015 | Shah et al. | |
| 9,248,840 B2 | 2/2016 | Truong | |
| 9,326,066 B2 | 4/2016 | Klippel | |
| 9,329,721 B1 | 5/2016 | Buuck et al. | |
| 9,354,704 B2 | 5/2016 | Lacroix et al. | |
| 9,368,005 B2 | 6/2016 | Cruz-Hernandez et al. | |
| 9,495,013 B2 | 11/2016 | Underkoffler et al. | |
| 9,507,423 B2 | 11/2016 | Gandhi et al. | |
| 9,513,709 B2 | 12/2016 | Gregorio et al. | |
| 9,520,036 B1 | 12/2016 | Buuck et al. | |
| 9,588,586 B2 | 3/2017 | Rihn | |
| 9,640,047 B2 | 5/2017 | Choi et al. | |
| 9,652,041 B2 | 5/2017 | Jiang et al. | |
| 9,696,859 B1 | 7/2017 | Heller et al. | |
| 9,697,450 B1 | 7/2017 | Lee | |
| 9,715,300 B2 | 7/2017 | Sinclair et al. | |
| 9,842,476 B2 | 12/2017 | Rihn et al. | |
| 9,864,567 B2 | 1/2018 | Seo | |
| 9,881,467 B2 | 1/2018 | Levesque | |
| 9,886,829 B2 | 2/2018 | Levesque | |
| 9,946,348 B2 | 4/2018 | Ulrich et al. | |
| 9,947,186 B2 | 4/2018 | Macours | |
| 9,959,744 B2 | 5/2018 | Koskan et al. | |
| 9,965,092 B2 | 5/2018 | Smith | |
| 10,032,550 B1 | 7/2018 | Zhang et al. | |
| 10,055,950 B2 | 8/2018 | Saboune et al. | |
| 10,074,246 B2 | 9/2018 | Da Costa et al. | |
| 10,110,152 B1 | 10/2018 | Hajati | |
| 10,171,008 B2 * | 1/2019 | Nishitani | H02N 2/026 |
| 10,175,763 B2 | 1/2019 | Shah | |
| 10,264,348 B1 * | 4/2019 | Harris | H04R 3/12 |
| 10,275,087 B1 | 4/2019 | Smith | |
| 10,447,217 B2 | 10/2019 | Zhao et al. | |
| 10,564,727 B2 | 2/2020 | Billington et al. | |
| 10,620,704 B2 | 4/2020 | Rand et al. | |
| 10,667,051 B2 | 5/2020 | Stahl | |
| 10,732,714 B2 | 8/2020 | Rao et al. | |
| 10,782,785 B2 | 9/2020 | Hu et al. | |
| 10,795,443 B2 | 10/2020 | Hu et al. | |
| 10,820,100 B2 | 10/2020 | Stahl et al. | |
| 10,828,672 B2 | 11/2020 | Stahl et al. | |
| 10,832,537 B2 | 11/2020 | Doy et al. | |
| 10,848,886 B2 | 11/2020 | Rand | |
| 10,969,871 B2 | 4/2021 | Rand et al. | |
| 2001/0043714 A1 * | 11/2001 | Asada | H04R 7/045 381/399 |
| 2002/0018578 A1 * | 2/2002 | Burton | H04R 3/14 381/431 |
| 2003/0068053 A1 | 4/2003 | Chu | |
| 2003/0214485 A1 | 11/2003 | Roberts | |
| 2005/0031140 A1 | 2/2005 | Browning | |
| 2005/0134562 A1 | 6/2005 | Grant et al. | |
| 2006/0028095 A1 | 2/2006 | Maruyama et al. | |
| 2006/0197753 A1 | 9/2006 | Hotelling | |
| 2006/0284856 A1 | 12/2006 | Soss | |
| 2008/0077367 A1 | 3/2008 | Odajima | |
| 2008/0226109 A1 * | 9/2008 | Yamakata | H04R 7/045 381/339 |
| 2008/0240458 A1 | 10/2008 | Goldstein et al. | |
| 2008/0293453 A1 | 11/2008 | Atlas et al. | |
| 2008/0316181 A1 | 12/2008 | Nurmi | |
| 2009/0020343 A1 | 1/2009 | Rothkopf et al. | |
| 2009/0079690 A1 | 3/2009 | Watson et al. | |
| 2009/0088220 A1 | 4/2009 | Persson | |
| 2009/0096632 A1 | 4/2009 | Ullrich et al. | |
| 2009/0102805 A1 | 4/2009 | Meijer et al. | |
| 2009/0128306 A1 | 5/2009 | Luden et al. | |
| 2009/0153499 A1 | 6/2009 | Kim et al. | |
| 2009/0278819 A1 | 11/2009 | Goldenberg et al. | |
| 2010/0013761 A1 | 1/2010 | Birnbaum et al. | |
| 2010/0141408 A1 | 6/2010 | Doy et al. | |
| 2010/0141606 A1 | 6/2010 | Bae et al. | |
| 2010/0260371 A1 | 10/2010 | Afshar | |
| 2010/0261526 A1 | 10/2010 | Anderson et al. | |
| 2011/0056763 A1 * | 3/2011 | Tanase | B60R 13/0815 181/295 |
| 2011/0075835 A1 | 3/2011 | Hill | |
| 2011/0141052 A1 | 6/2011 | Bernstein et al. | |
| 2011/0161537 A1 | 6/2011 | Chang | |
| 2011/0163985 A1 | 7/2011 | Bae et al. | |
| 2011/0167391 A1 | 7/2011 | Momeyer et al. | |
| 2012/0011436 A1 | 1/2012 | Jinkinson et al. | |
| 2012/0105358 A1 | 5/2012 | Momeyer et al. | |
| 2012/0112894 A1 | 5/2012 | Yang et al. | |
| 2012/0206246 A1 | 8/2012 | Cruz-Hernandez et al. | |
| 2012/0206247 A1 | 8/2012 | Bhatia et al. | |
| 2012/0229264 A1 | 9/2012 | Company Bosch et al. | |
| 2012/0253698 A1 | 10/2012 | Cokonaj | |
| 2012/0274243 A1 * | 11/2012 | Sumioka | H04N 5/2171 318/116 |
| 2012/0306631 A1 | 12/2012 | Hughes | |
| 2013/0016855 A1 | 1/2013 | Lee et al. | |
| 2013/0027359 A1 | 1/2013 | Schevin et al. | |
| 2013/0038792 A1 | 2/2013 | Quigley et al. | |
| 2013/0096849 A1 | 4/2013 | Campbell et al. | |
| 2013/0141382 A1 | 6/2013 | Simmons et al. | |
| 2013/0275058 A1 | 10/2013 | Awad | |
| 2013/0289994 A1 | 10/2013 | Newman et al. | |
| 2014/0056461 A1 | 2/2014 | Afshar | |
| 2014/0064516 A1 | 3/2014 | Cruz-Hernandez et al. | |
| 2014/0079248 A1 | 3/2014 | Short et al. | |
| 2014/0085064 A1 | 3/2014 | Crawley et al. | |
| 2014/0118126 A1 | 5/2014 | Garg et al. | |
| 2014/0119244 A1 | 5/2014 | Steer et al. | |
| 2014/0139327 A1 | 5/2014 | Bau et al. | |
| 2014/0226068 A1 | 8/2014 | Lacroix et al. | |
| 2014/0292501 A1 | 10/2014 | Lim et al. | |
| 2014/0340209 A1 | 11/2014 | Lacroix et al. | |
| 2014/0347176 A1 | 11/2014 | Modarres et al. | |

(56) References Cited

U.S. PATENT DOCUMENTS

| | | |
|---|---|---|
| 2015/0070149 A1 | 3/2015 | Cruz-Hernandez et al. |
| 2015/0070151 A1 | 3/2015 | Cruz-Hernandez et al. |
| 2015/0070260 A1 | 3/2015 | Saboune et al. |
| 2015/0084752 A1 | 3/2015 | Heubel et al. |
| 2015/0117686 A1* | 4/2015 | Kim ............... H04R 1/028 381/306 |
| 2015/0130767 A1 | 5/2015 | Myers et al. |
| 2015/0208189 A1 | 7/2015 | Tsai |
| 2015/0216762 A1 | 8/2015 | Oohashi et al. |
| 2015/0234464 A1 | 8/2015 | Yliaho |
| 2015/0324116 A1 | 11/2015 | Marsden et al. |
| 2015/0341714 A1* | 11/2015 | Ahn ............... G06F 1/1688 381/333 |
| 2016/0004311 A1 | 1/2016 | Yliaho |
| 2016/0007095 A1 | 1/2016 | Lacroix |
| 2016/0063826 A1 | 3/2016 | Morrell et al. |
| 2016/0070392 A1 | 3/2016 | Wang et al. |
| 2016/0074278 A1 | 3/2016 | Muench et al. |
| 2016/0132118 A1 | 5/2016 | Park et al. |
| 2016/0162031 A1 | 6/2016 | Westerman et al. |
| 2016/0179203 A1 | 6/2016 | Modarres et al. |
| 2016/0239089 A1 | 8/2016 | Taninaka et al. |
| 2016/0246378 A1 | 8/2016 | Sampanes et al. |
| 2016/0358605 A1 | 12/2016 | Ganong, III et al. |
| 2017/0052593 A1 | 2/2017 | Jiang et al. |
| 2017/0078804 A1 | 3/2017 | Guo et al. |
| 2017/0083096 A1 | 3/2017 | Rihn et al. |
| 2017/0090572 A1 | 3/2017 | Holenarsipur et al. |
| 2017/0090573 A1 | 3/2017 | Hajati et al. |
| 2017/0153760 A1 | 6/2017 | Chawda et al. |
| 2017/0168574 A1 | 6/2017 | Zhang |
| 2017/0169674 A1 | 6/2017 | Macours |
| 2017/0220197 A1* | 8/2017 | Matsumoto ............. G06F 3/016 |
| 2017/0256145 A1 | 9/2017 | Macours et al. |
| 2017/0277350 A1 | 9/2017 | Wang et al. |
| 2017/0357440 A1 | 12/2017 | Tse |
| 2018/0059733 A1 | 3/2018 | Gault et al. |
| 2018/0059793 A1 | 3/2018 | Hajati |
| 2018/0067557 A1 | 3/2018 | Robert et al. |
| 2018/0074637 A1 | 3/2018 | Rosenberg et al. |
| 2018/0082673 A1* | 3/2018 | Tzanetos ......... G10K 11/17857 |
| 2018/0084362 A1 | 3/2018 | Zhang et al. |
| 2018/0151036 A1 | 5/2018 | Cha et al. |
| 2018/0158289 A1 | 6/2018 | Vasilev et al. |
| 2018/0159452 A1 | 6/2018 | Eke et al. |
| 2018/0159457 A1 | 6/2018 | Eke |
| 2018/0159545 A1 | 6/2018 | Eke et al. |
| 2018/0160227 A1 | 6/2018 | Lawrence et al. |
| 2018/0165925 A1 | 6/2018 | Israr et al. |
| 2018/0178114 A1 | 6/2018 | Mizuta et al. |
| 2018/0182212 A1 | 6/2018 | Li et al. |
| 2018/0183372 A1 | 6/2018 | Li et al. |
| 2018/0196567 A1 | 7/2018 | Klein et al. |
| 2018/0237033 A1 | 8/2018 | Hakeem et al. |
| 2018/0253123 A1 | 9/2018 | Levesque et al. |
| 2018/0255411 A1 | 9/2018 | Lin et al. |
| 2018/0267897 A1 | 9/2018 | Jeong |
| 2018/0294757 A1 | 10/2018 | Feng et al. |
| 2018/0301060 A1 | 10/2018 | Israr et al. |
| 2018/0321748 A1 | 11/2018 | Rao et al. |
| 2018/0329172 A1 | 11/2018 | Tabuchi |
| 2018/0335848 A1 | 11/2018 | Moussette et al. |
| 2018/0367897 A1 | 12/2018 | Bjork et al. |
| 2019/0064925 A1 | 2/2019 | Kim et al. |
| 2019/0069088 A1 | 2/2019 | Seiler |
| 2019/0073078 A1 | 3/2019 | Sheng et al. |
| 2019/0103829 A1 | 4/2019 | Vasudevan et al. |
| 2019/0138098 A1 | 5/2019 | Shah |
| 2019/0163234 A1* | 5/2019 | Kim ............... G06F 1/1637 |
| 2019/0196596 A1 | 6/2019 | Yokoyama et al. |
| 2019/0206396 A1 | 7/2019 | Chen |
| 2019/0215349 A1 | 7/2019 | Adams et al. |
| 2019/0220095 A1 | 7/2019 | Ogita et al. |
| 2019/0227628 A1 | 7/2019 | Rand et al. |
| 2019/0228619 A1 | 7/2019 | Yokoyama et al. |
| 2019/0114496 A1 | 8/2019 | Lesso |
| 2019/0235629 A1 | 8/2019 | Hu et al. |
| 2019/0294247 A1 | 9/2019 | Hu et al. |
| 2019/0296674 A1 | 9/2019 | Janko et al. |
| 2019/0297418 A1 | 9/2019 | Stahl |
| 2019/0311590 A1 | 10/2019 | Doy et al. |
| 2019/0341903 A1 | 11/2019 | Kim |
| 2020/0117506 A1 | 4/2020 | Chan |
| 2020/0401292 A1 | 12/2020 | Lorenz et al. |
| 2021/0108975 A1 | 4/2021 | Peso Parada et al. |

FOREIGN PATENT DOCUMENTS

| | | |
|---|---|---|
| CN | 103403796 A | 11/2013 |
| CN | 204903757 U | 12/2015 |
| CN | 105264551 A | 1/2016 |
| CN | 106438890 A | 2/2017 |
| CN | 106950832 A | 7/2017 |
| CN | 107665051 A | 2/2018 |
| EP | 0784844 B1 | 6/2005 |
| EP | 2363785 A1 | 9/2011 |
| EP | 2487780 A1 | 8/2012 |
| EP | 2600225 A2 | 6/2013 |
| EP | 2846218 A1 | 3/2015 |
| EP | 2846229 A2 | 3/2015 |
| EP | 2846329 A1 | 3/2015 |
| EP | 2988528 A1 | 2/2016 |
| EP | 3125508 A1 | 2/2017 |
| EP | 3379382 A1 | 9/2018 |
| GB | 201620746 A | 1/2017 |
| IN | 201747044027 | 8/2018 |
| JP | H02130433 B2 | 5/1990 |
| JP | 08149006 A | 6/1996 |
| JP | 2011059208 * | 3/2011 |
| JP | 6026751 B2 | 11/2016 |
| JP | 6250985 | 12/2017 |
| JP | 6321351 | 5/2018 |
| KR | 20120126446 A | 11/2012 |
| WO | 2013104919 A1 | 7/2013 |
| WO | 2013186845 A1 | 12/2013 |
| WO | 2014018086 A1 | 1/2014 |
| WO | 2014094283 A1 | 6/2014 |
| WO | 2016105496 A1 | 6/2016 |
| WO | 2016164193 A1 | 10/2016 |
| WO | 2017113651 A1 | 7/2017 |
| WO | 2018053159 A1 | 3/2018 |
| WO | 2018067613 A1 | 4/2018 |
| WO | 2018125347 A1 | 7/2018 |
| WO | 2020004840 A1 | 1/2020 |
| WO | 2020055405 A1 | 3/2020 |

OTHER PUBLICATIONS

International Search Report and Written Opinion of the International Searching Authority, International Application No. PCT/GB2019/050770, dated Jul. 5, 2019.

Communication Relating to the Results of the Partial International Search, and Provisional Opinion Accompanying the Partial Search Result, of the International Searching Authority, International Application No. PCT/US2018/031329, dated Jul. 20, 2018.

Combined Search and Examination Report, UKIPO, Application No. GB1720424.9, dated Jun. 5, 2018.

International Search Report and Written Opinion of the International Searching Authority, International Application No. PCT/GB2019/052991, dated Mar. 17, 2020.

International Search Report and Written Opinion of the International Searching Authority, International Application No. PCT/US2020/023342, dated Jun. 9, 2020.

International Search Report and Written Opinion of the International Searching Authority, International Application No. PCT/GB2020/050823, dated Jun. 30, 2020.

International Search Report and Written Opinion of the International Searching Authority, International Application No. PCT/GB2020/051037, dated Jul. 9, 2020.

Communication Relating to the Results of the Partial International Search, and Provisional Opinion Accompanying the Partial Search

(56) References Cited

OTHER PUBLICATIONS

Result, of the International Searching Authority, International Application No. PCT/GB2020/050822, dated Jul. 9, 2020.
International Search Report and Written Opinion of the International Searching Authority, International Application No. PCT/GB2020/051035, dated Jul. 10, 2020.
International Search Report and Written Opinion of the International Searching Authority, International Application No. PCT/US2020/024864, dated Jul. 6, 2020.
International Search Report and Written Opinion of the International Searching Authority, International Application No. PCT/GB2020/050822, dated Aug. 31, 2020.
International Search Report and Written Opinion of the International Searching Authority, International Application No. PCT/GB2020/051438, dated Sep. 28, 2020.
First Examination Opinion Notice, State Intellectual Property Office of the People's Republic of China, Application No. 201880037435.X, dated Dec. 31, 2020.
International Search Report and Written Opinion of the International Searching Authority, International Application No. PCT/US2020/056610, dated Jan. 21, 2021.
Invitation to Pay Additional Fees, Partial International Search Report and Provisional Opinion of the International Searching Authority, International Application No. PCT/US2020/052537, dated Jan. 14, 2021.
International Search Report and Written Opinion of the International Searching Authority, International Application No. PCT/GB2020/052537, dated Mar. 9, 2021.
Notice of Preliminary Rejection, Korean Intellectual Property Office, Application No. 10-2019-7036236, datd Jun. 29, 2021.
Combined Search and Examination Report, United Kingdom Intellectual Property Office, Application No. GB2018051.9, dated Jun. 30, 2021.
Communication pursuant to Rule 164(2)(b) and Article 94(3) EPC, European Patent Office, Application No. 18727512.8, dated Jul. 8, 2021.
Gottfried Behler: "Measuring the Loudspeaker's Impedance during Operation for the Derivation of the Voice Coil Temperature", AES Convention Preprint, Feb. 25, 1995 (Feb. 25, 1995), Paris.
Office Action of the Intellectual Property Office, ROC (Taiwan) Patent Application No. 107115475, datd Apr. 30, 2021.
First Office Action, China National Intellectual Property Administration, Patent Application No. 2019800208570, dated Jun. 3, 2021.
International Search Report and Written Opinion of the International Searching Authority, International Application No. PCT/US2021/021908, dated Jun. 9, 2021.
First Office Action, China National Intellectual Property Administration, Patent Application Number 2019800211287, dated Jul. 5, 2021.
Steinbach et al., Haptic Data Compression and Communication, IEEE Signal Processing Magazine, Jan. 2011.
Pezent et al., Syntacts Open-Source Software and Hardware for Audio-Controlled Haptics, IEEE Transactions on Haptics, vol. 14, No. 1, Jan.-Mar. 2021.
Examination Report under Section 18(3), United Kingdom Intellectual Property Office, Application No. GB2018051.9, dated Nov. 5, 2021.

* cited by examiner

SURFACE SPEAKER

TECHNICAL FIELD

Embodiments disclosed herein relate to an audio device comprising a surface speaker. In particular, embodiments disclosed herein relate to the positioning of surface transducers on a surface in order to optimise a frequency response of the surface.

BACKGROUND

One method of generating an audio output from an electronic device such as a phone, tablet computer, television, laptop or desktop computer, or any other suitable device having an audio output, is to use a screen or surface of the device as the loudspeaker. The screen of the device may vibrate in a similar way as a diaphragm of a loud speaker. These vibrations displace the surrounding air creating soundwaves.

To vibrate the screen of an audio device, one or more surface transducers, for example piezo devices, moving magnetic voice coils, or other transducers capable of translating an input audio signal into movement to vibrate the screen, may be placed on the screen to vibrate the screen in order to translate an input audio signal into an acoustic output.

FIG. 1 illustrates an example of an audio device 100. In this example, the audio device 100 comprises a smartphone having a Liquid Crystal Display (LCD) screen 101. The LCD screen 101 is used as a loudspeaker. Two surface transducers 102 and 103 are placed on the LCD screen 101. In this example, the two surface transducers are placed at opposite ends of the LCD screen in order to provide a stereo output. The input signals received by the two surface transducers 102 and 103 may therefore be stereo input signals.

SUMMARY

According to embodiments described herein, there is provided an audio device. The audio device comprises at least one surface, a first surface transducer positioned to excite first modes of oscillation in a first surface of the at least one surface, and a second surface transducer positioned to excite second modes of oscillation in a second surface of the at least one surface, wherein the first modes of oscillation are of a higher frequency than the second modes of oscillation.

According to some embodiments, there is provided an audio device. The audio device comprises a first surface, a second surface, a first surface transducer configured to excite high frequency oscillations in the first surface, and a second surface transducer configured to excite low frequency oscillations in the second surface.

According to some embodiments, there is provided an audio device. The audio device comprises at least one surface, a first surface transducer positioned in a first location on a first surface of the at least one surface which has a first stiffness relating to displacement of the first location on the first surface from an equilibrium position, and a second surface transducer positioned in a second location on a second surface of the at least one surface which has a second stiffness relating to displacement of the second location of the second surface from an equilibrium position.

BRIEF DESCRIPTION OF THE DRAWINGS

For a better understanding of the embodiments of the present disclosure, and to show how it may be put into effect, reference will now be made, by way of example only, to the accompanying drawings, in which.

DESCRIPTION

Figure 1:
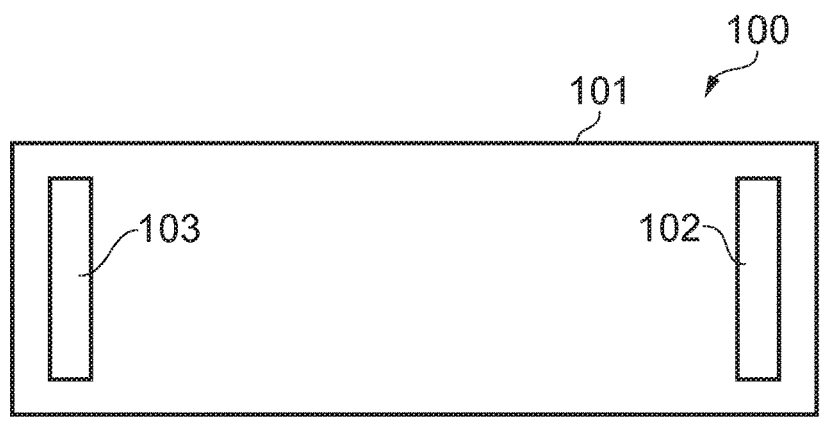
FIG. 1 is an example of an audio device in accordance with the prior art.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

One of the challenges of driving a screen or surface as a loudspeaker is obtaining an adequate low frequency bass response. The use of the screen of a device as the speaker diaphragm is an improvement over, for example, microspeaker diaphragms in this regard, as the larger size of the screen allows for the reproduction of lower frequencies. However, there is still a need to optimize the low frequency response, particularly as the frequency response of the human ear is non-linear, and therefore lower frequencies are often reproduced at higher decibels than higher frequencies, in order for them to be perceived in a similar way by the human ear.

If a surface, such as a smartphone screen, is attached to a fixed support structure at the edges of the surface, in a similar way to a smartphone screen being attached at the edges to the body of the smartphone, then striking the surface at some specific location may cause the surface to vibrate in a particular transient way. This property characteristic is similar to a drum which, when struck with a drumstick, vibrates to produce an acoustic sound. If the location at which the surface of the drum is struck is changed, then the sound itself may change. In other words, the frequency response of the drum changes depending on where on the surface the drum is struck.

The impulse response of a surface is therefore dependent on the location of the impulse force. If a transducer is placed at a particular location on a surface and an input audio signal applied to the transducer (i.e. the transducer causes vibrations of a particular frequencies), the acoustic output signal may be described as the input audio signal filtered in the time domain by the impulse response of the surface at that particular location. This filtering applied by the impulse response of the surface will therefore be reflected in the acoustic output from the vibrating surface.

The frequency response of the surface at a particular location is the Fourier transform (FT) of the impulse response at that location. A different location on the surface may have a different impulse response and, as a result, a different frequency response.

The impulse response of a surface comprises a sum of a number of decaying sinusoidal tones of different frequencies, amplitudes, phases, and decay rates. The frequencies of the sinusoidal tones are the natural resonant frequencies (or eigenfrequencies) of the surface. The eigenfrequencies of the surface are the frequencies that will naturally occur when the surface is struck impulsively and allowed to resonate.

Figure 2A:
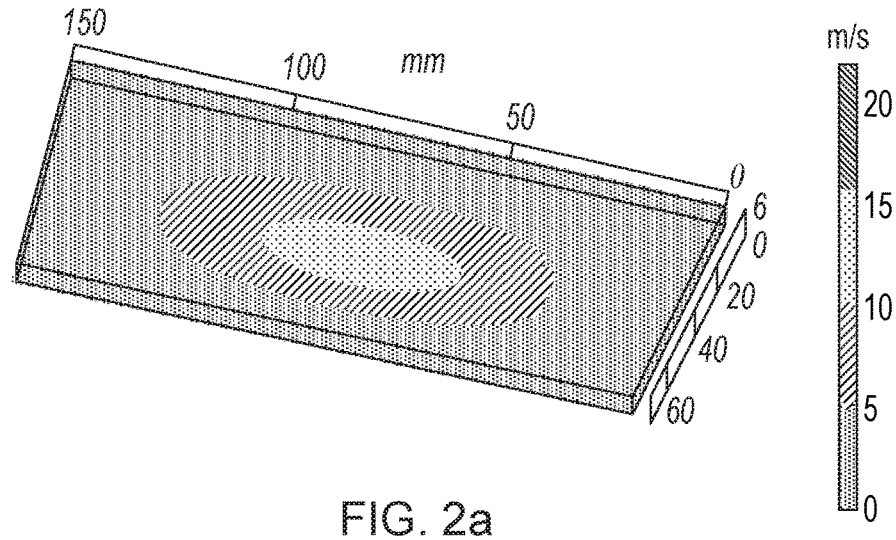
FIGS. 2a to 2e are example plots illustrating the displacement of a rectangular surface when oscillating in different normal modes of oscillation.
Figure 2B:
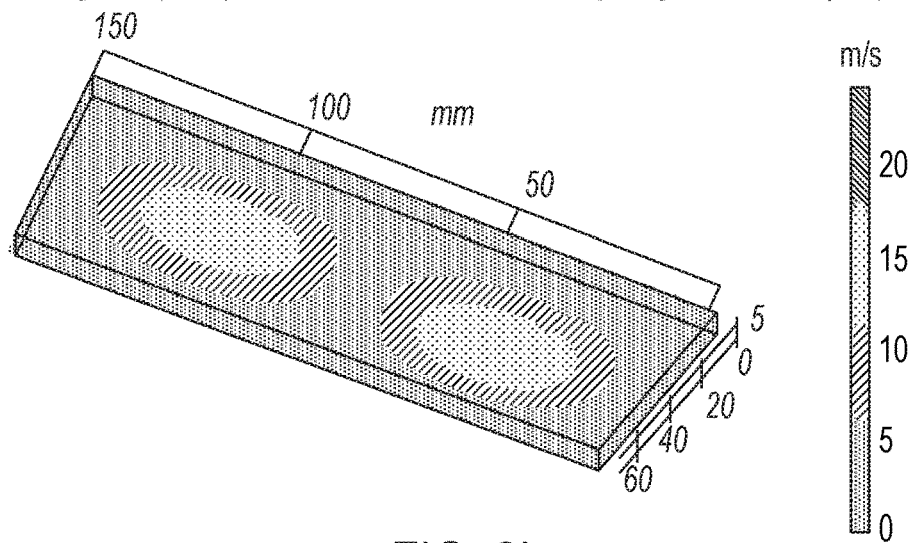
Figure 2C:
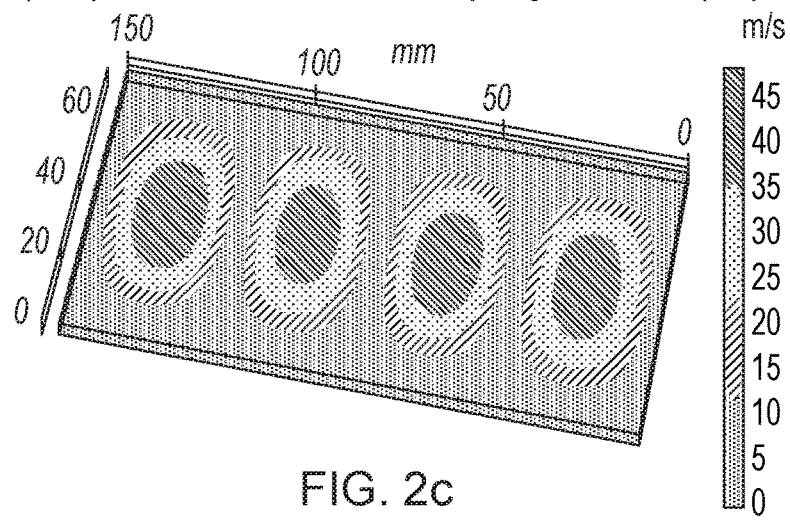
Figure 2D:
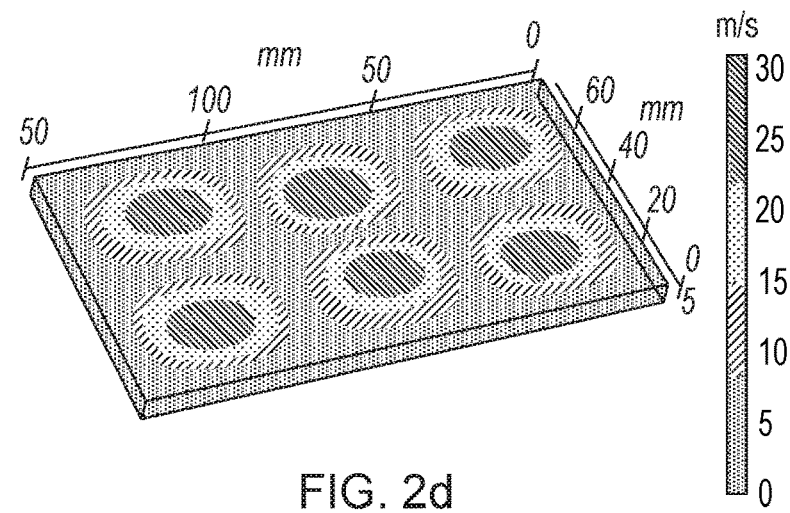
Figure 2E:
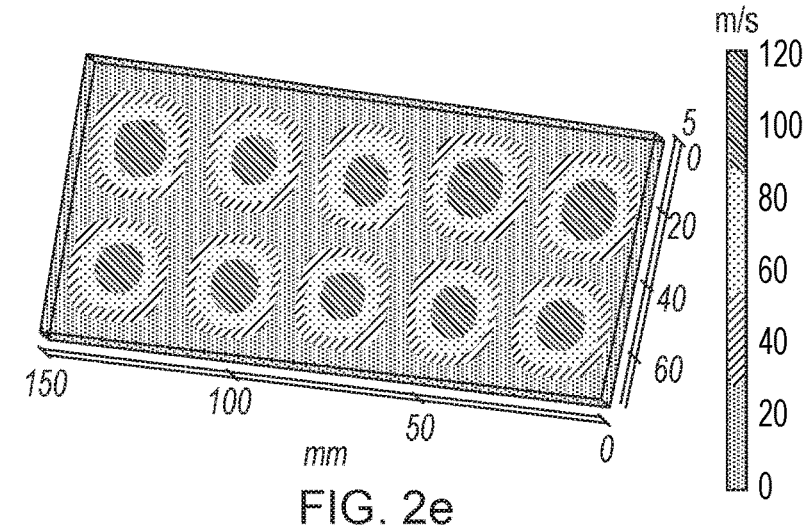

Associated with each natural frequency is a mode of oscillation (eigenmode). This mode of oscillation is the oscillatory pattern that is formed on the surface for each natural frequency tone. FIGS. 2a to 2e illustrate the normal modes of oscillation of an example rectangular surface which is fixed at the edges. In particular, FIG. 2a illustrates the fundamental mode of oscillation, FIG. 2b illustrates a second mode of oscillation, FIG. 2c illustrates a third mode of oscillation, FIG. 2d illustrates a fourth mode of oscillation, and FIG. 2e illustrates a fifth mode of oscillation.

The amplitudes and phases of the sinusoidal tones associated with the normal modes of oscillation at these natural frequencies may depend on where the surface is struck. This spatial dependence of the amplitude and phase of the normal mode oscillations may be due to the shapes of the normal modes of oscillation on the surface. Since, in this example, the surface is fixed at the edges, boundary constraints apply where the displacement, velocity, and acceleration at the edges are always zero. All oscillations of the surface are therefore subject to these boundary constraints. It will, however, be appreciated that in some examples, different boundary constraints may apply. Any normal mode comprises a sinusoidal displacement pattern over the surface, for example as illustrated in FIGS. 2a through 2e. These sinusoidal displacement patterns are sinusoidal in two dimensions. In this example, there is always an integer number of half sinusoidal cycles in the x and y directions for any mode because of the previously mentioned boundary constraints.

The location(s) at which a peak displacement of a normal mode occurs is referred to as an anti-node of the normal mode, and the location(s) at which the displacement is zero is referred to as a node of the normal mode.

The first normal mode, or fundamental mode, is shown in FIG. 2a. This fundamental mode is the normal mode of the surface that oscillates with the lowest frequency. As illustrated, in this example, the fundamental mode of the surface has a single anti-node in the middle of the surface.

An anti-node of a mode of oscillation occurs at a point of maximum displacement for that particular mode. An anti-node is therefore a point at which the surface may therefore bend the most for the mode of oscillation. Therefore, a force applied to the middle of the surface will cause a large amplitude or displacement of the fundamental mode of oscillation because the force is acting on the anti-node of the fundamental mode. In contrast, a force applied near the edge of the surface results in a low amplitude or displacement of the fundamental mode because the energy is not easily translated into the displacement of the anti-node of the fundamental mode. An impulse force applied near the edge of a surface may, however, be close to the anti-nodes of higher frequency modes and so may be effective at exciting those modes.

When the surface is struck, the impulse force may excite many different modes of oscillation of the surface simultaneously, but the amplitudes of the excited modes may vary. In particular, the amplitude for a given mode of oscillation may depend on the distance of the location of the impulse force from the nearest anti-node of that mode of oscillation.

Furthermore, each normal mode of oscillation is associated with a natural frequency of that mode (or eigenfrequency). This natural frequency is the sinusoidal frequency that is generated when the normal mode is excited. For example, as illustrated in FIG. 2a, the fundamental mode oscillates at a frequency F1, where in this example F1 is 546.02 Hz. This frequency is the lowest resonant frequency of the surface. The second mode illustrated in FIG. 2b oscillates at a frequency F2, where in this example F2 is 690.93 Hz. F2 is a higher frequency than F1. The third mode illustrated in FIG. 2c oscillates at a frequency F3, where in this example F3 is 1279.2 Hz. F3 is a higher frequency than F2. The fourth mode illustrated in FIG. 2d oscillates at a frequency F4, where in this example F4 is 1841.2 Hz. F4 is a higher frequency than F3. The fifth mode of oscillation illustrated in FIG. 2e oscillates at a frequency F5, where in this example F5 is 2655.7 Hz. F5 is a higher frequency than F4. It will be appreciated that there are many modes of oscillation that are not illustrated, and that the frequencies of the modes of oscillation increase. As can be seen, the fundamental mode is associated with the lowest frequency of oscillation, and therefore produces the lowest frequency acoustic output. As the mode of oscillation becomes higher, the frequency produced becomes higher.

An impulse force applied to the middle of the surface illustrated in FIGS. 2a to 2e would be near the anti-node for the fundamental mode, and may therefore produce high amplitude oscillations of the fundamental mode. These large amplitude oscillations of the fundamental mode may therefore translate into a high amplitude acoustic response at the frequency associated with the fundamental mode.

However, an impulse force applied to the middle of the surface will be at a node between two anti-nodes for the second normal mode of oscillation, illustrated in FIG. 2b. If an impulse force is applied to a node of a mode of oscillation, then that mode of oscillation is not excited as a result of the impulse force. Such an impulse force would therefore produce little or no oscillation of the second mode, and therefore no acoustic output at the frequency associated with the second normal mode. Therefore, the impulse response associated with an impulse force at the middle of the surface may have a large amplitude component at the first eigenfrequency F1 and a small or zero amplitude component at the second eigenfrequency F2.

Similarly, an impulse force applied to the surface near one of the anti-nodes of the second mode of oscillation illustrated in FIG. 2b may result in a large amplitude component at the second eigenfrequency F2 and a smaller, but non-zero amplitude component at the first eigenfrequency F1.

The result may therefore be a varying frequency response, i.e. varying amplitudes of each of the components of decaying eigenfrequencies, depending on the location of the impulse force.

The lower modes of oscillation have lower eigenfrequencies, and the higher modes have higher eigenfrequencies. Therefore, the impulse response for an impulse force located at the center of the surface, or at the anti-node of the fundamental mode, may result in higher amplitudes of the lower frequency modes, i.e. modes 1, 3, 5 illustrated in FIGS. 2a, 2c and 2d, than an impulse force located at the edge of the surface.

The higher amplitudes of the lower frequency modes, may therefore result in louder lower frequency components in the frequency response when an audio signal is produced using a surface transducer located at the anti-node of the fundamental mode, than the lower frequency components in the frequency response when an audio signal is produced using a transducer located near the edge of the surface which can only effectively excite the higher modes of oscillation with large amplitudes.

Figure 3A:
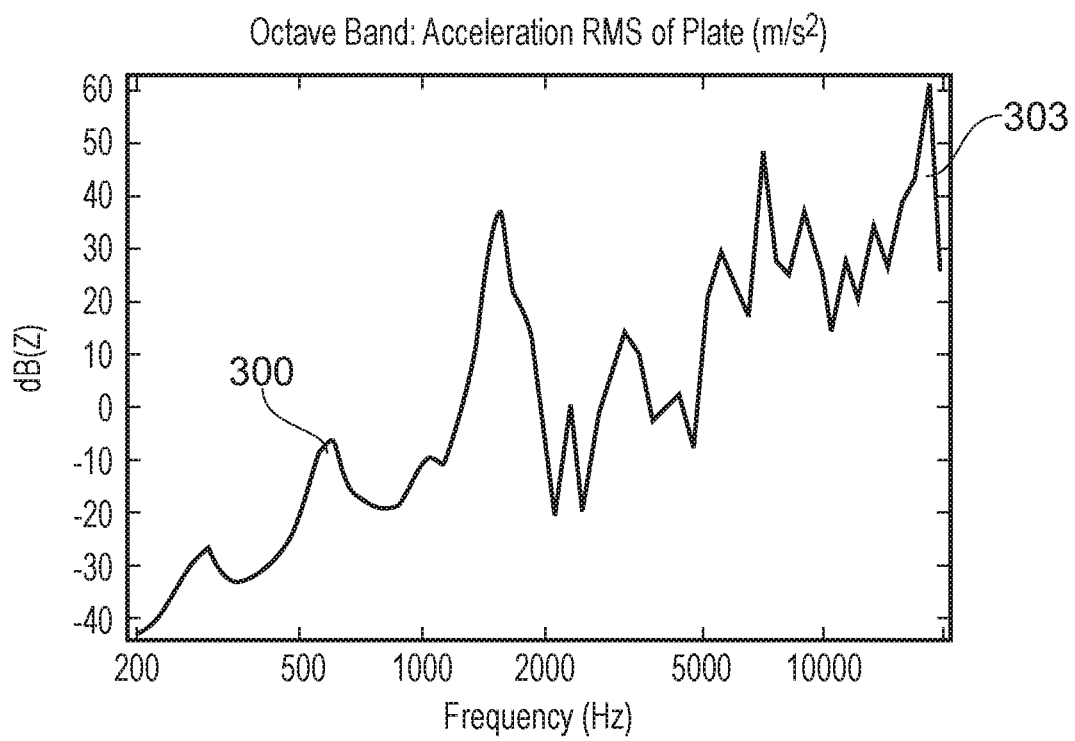
FIG. 3a is a graph of an example of the frequency response of a surface when a surface transducer is placed at the center of the surface.
Figure 3B:
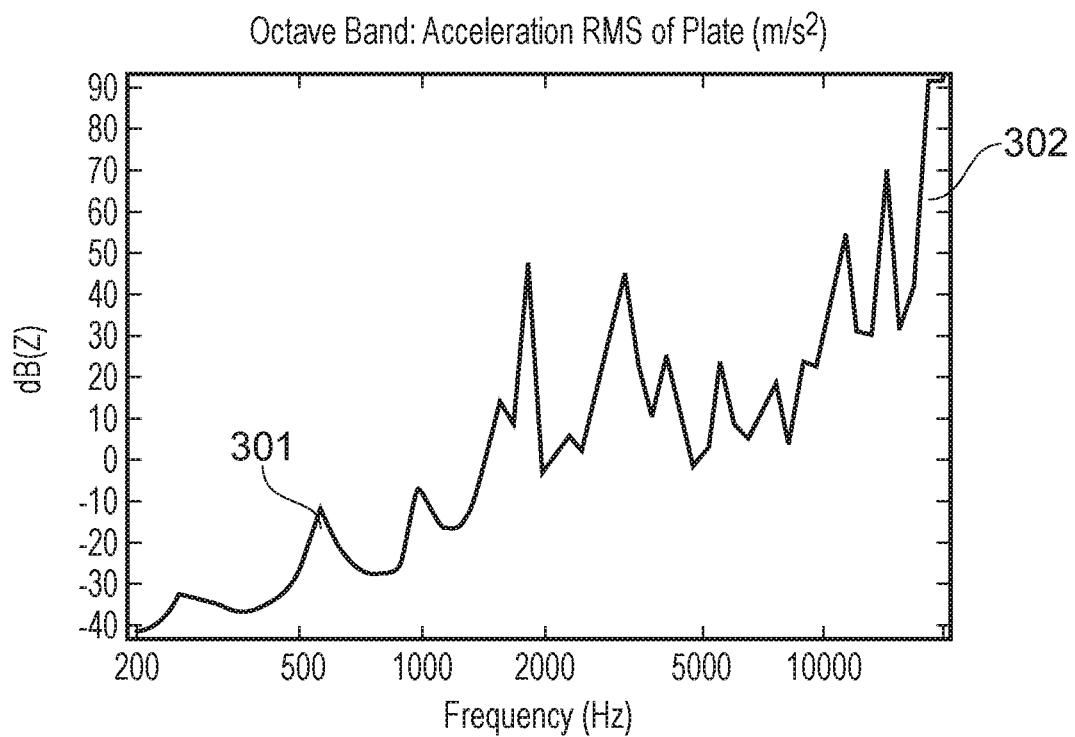
FIG. 3b is a graph of an example of the frequency response of a surface when a surface transducer is placed near the edge of the surface.

As a result, a surface transducer placed at the center of the surface may have a more lowpass acoustic frequency response than a surface transducer placed near the edge of the surface which may have a more highpass acoustic frequency response. Such responses are demonstrated in FIGS. 3a and 3b. FIG. 3a illustrates the frequency response of a surface when the transducer is placed at the center of the surface, e.g. at the anti-node of the fundamental mode of oscillation. FIG. 3b illustrates the frequency response of the surface when the transducer is placed near the edge of the surface.

The sound pressure level of a sound generated by a vibrating object is proportional to the acceleration of the object. Acceleration is the second derivative of the displacement of the object with respect to time. The second derivative of a sinusoid with respect to the phase angle has the same amplitude as the original signal. However, the second derivative with respect to time has an amplitude that goes up as the square of frequency. In other words, in order to maintain a constant sound pressure level across different frequencies, and hence a constant acceleration across different frequencies, for a vibrating object driven by a sinusoidal input signal, the amplitude of the input sinusoid will go down as the square of frequency. Since amplitude of the input sinusoid is proportional to the displacement of the object, the displacement will also go down as the square of frequency to maintain a constant acceleration and therefore a constant sound pressure level.

This principle may also be applied to a vibrating surface. For a constant sound pressure level across different frequencies, the acceleration of the sum of all modes of oscillation at any point on the surface must be constant across frequency. This relationship implies that the displacement at any point on the surface will go down as the square of frequency. So, for constant sound pressure level, the displacement of the surface will be much smaller at high frequencies than at low frequencies.

Stiffness may be considered as being a property inversely proportional to the amount of displacement that occurs in response to an applied force. For example, the more displacement that occurs for a given force, the less stiff is the surface. Force equals mass times acceleration, so for constant acceleration and mass, i.e. constant force, the displacement will go down as the square of frequency, and so the stiffness will go up as the square of frequency. Therefore, a location on the surface, such as the middle of the surface, that has a more lowpass frequency response and higher displacements, i.e. excites lower frequency oscillatory modes, may be considered less stiff than a location on the surface, such as the edge of the surface, which has lower displacements and primarily excites higher frequency oscillatory modes. (See, Philip M. Morse, K. Uno Ingard, Theoretical Acoustics, Princeton University Press, Princeton N.J., Copyright 1968 McGraw-Hill, ISBN-691-08425-4).

As is illustrated in FIGS. 3a and 3b, where the surface transducer is placed at the center of the surface, i.e. FIG. 3a, the amplitude (e.g. decibels) of oscillations at lower frequencies are larger, for example, see the peak 300 as opposed to the peak 301 in FIG. 3b. However, the amplitude of higher frequencies is larger in FIG. 3b, where the surface transducer is placed at the edge of the surface, see peak 302 as opposed to peak 303.

Figure 4A:
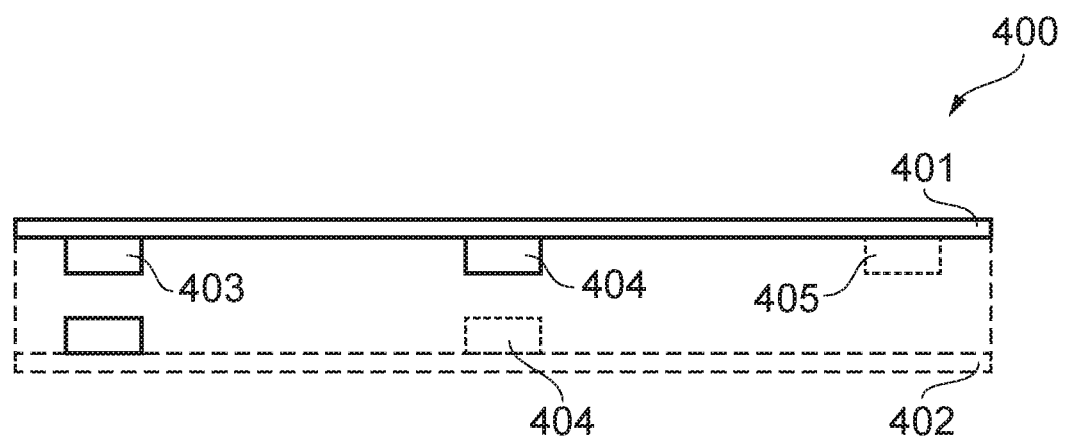
FIG. 4a illustrates a side view of an audio device in accordance with embodiments of the present disclosure.
Figure 4B:
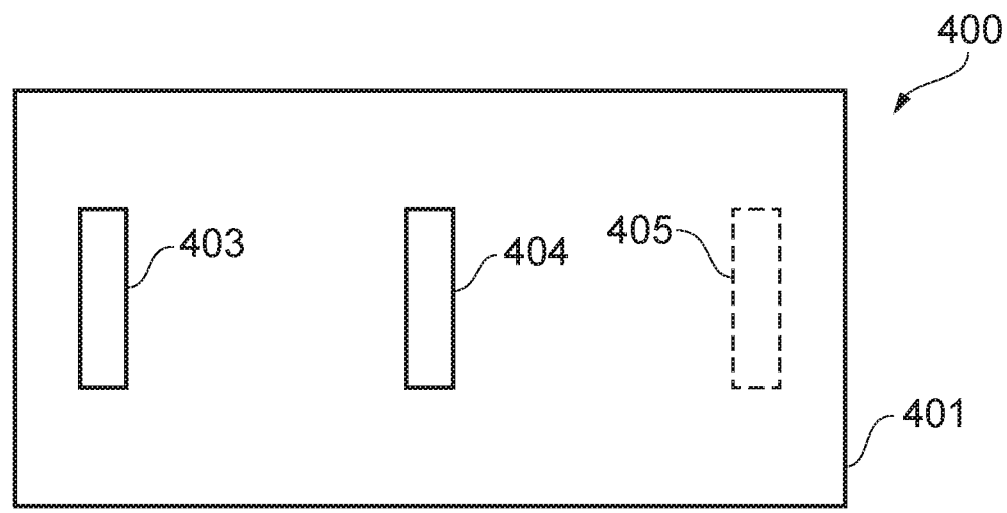
FIG. 4b is a top down view of an audio device in accordance with embodiments of the present disclosure.

FIGS. 4a and 4b therefore illustrate an audio device according to one embodiment of the present disclosure. FIG. 4a is a side view of the audio device 400. FIG. 4b is a top down view of the audio device 400. The audio device 400 comprises at least one surface. In this example, there are two surfaces: a first surface 401 and a second surface 402. However, it will be appreciated that the audio device may comprise only one surface. In this example, the first and second surfaces 401 and 402 are both rectangular and have edge boundary conditions. However, it will be appreciated that in some examples, different boundary constraints may apply and different shaped surfaces may be used.

The audio device 400 further comprises a first surface transducer 403. The first surface transducer 403 may be positioned to excite first modes of oscillation in a first surface of the at least one surface.

In other words, the first surface transducer 403 may be positioned in a first location on the first surface 401 which has a first stiffness relating to displacement of the first location on first surface 401 from an equilibrium position. In this example, the first surface transducer 403 is positioned on or coupled to the first surface 401.

The audio device 400 further comprises a second surface transducer 404. The second surface transducer 404 may be positioned to excite second modes of oscillation in a second surface of the at least one surface. The second surface of the at least one surface may comprise the first surface 401 or the second surface 402. In other words, the second surface transducer 404 may be positioned on or coupled to the same surface as the first surface transducer, or a different surface, as illustrated in FIG. 4a.

For example, the second surface transducer 404 may be positioned in a second location on the first surface 401 or the second surface 402 which has a second stiffness relating to displacement of second location of the first surface 401 or the second surface 402 from an equilibrium position.

It will be appreciated that the first and second surface transducers 403 and 404 may comprise piezo devices, moving magnetic voice coils, or any other transducers capable of translating an input audio signal into movement to vibrate the first or second surfaces. Furthermore, it will be appreciated that the first and second surface transducers 403 and 404 may comprise different types of surface transducers. For example, the first surface transducer 403 may comprise a piezo device whereas the second surface transducer 404 may comprise a moving magnetic voice coil.

For example, in some embodiments, both the first surface transducer 403 and the second surface transducer 404 are positioned to excite modes of oscillation in the first surface 401, where the first surface 401 may be, for example, a screen or front surface of an audio device. However, in some examples, the first surface transducer 403 and the second surface transducer 404 are positioned to excite modes of oscillation in different surfaces, for example the first surface transducer 403 may be positioned to excite modes of oscillation in the screen or front surface 401 of the audio device, and the second surface transducer 404 may be positioned to excite modes of oscillation in a back surface 402 of the audio device 400.

In some examples, both the first and second surface transducers 403 and 404 may be coupled to excite modes of oscillation in both the first surface 401 and the second surface 402. In this example, the first and second surfaces may be designed such that they have differing frequency responses. In other words, one surface may be designed to better produce higher frequencies and the other surface may be designed to better produce lower frequencies.

The first modes of oscillation are of a higher frequency than the second modes of oscillation. In other words, as previously described, the first surface transducer 403 may be positioned near to a fixed boundary of the first surface 401, whereas the second surface transducer 404 may be positioned a maximum distance from the fixed boundary of the first surface 401 or second surface 402.

In some examples, the second surface transducer 404 is located at an anti-node of a fundamental mode of oscillation of the first surface or the second surface. In other words, the second surface transducer 404 is positioned to best excite the lowest frequency mode of oscillation. In some examples, the anti-node of the fundamental mode of oscillation may not be in the exact center of the first surface 401 or the second surface 402. For example, the first surface 401 or second surface 402 may not be entirely linear or planar, and/or the thickness or stiffness of the surface's material may vary. This varying profile of the first surface 401 or second surface 402 may have an effect on the distribution of the normal modes of oscillation, and may therefore shift the locations of the anti-nodes and nodes of the modes of oscillation.

In some examples, the first surface transducer 403 may be positioned at an anti-node of a high order mode of oscillation of the first surface 401. In other words, the first surface transducer 403 may be positioned at an anti-node of a mode of oscillation with a higher frequency than the frequency of the fundamental mode of oscillation.

In some examples, the audio device 400 further comprises a third surface transducer 405. The third surface transducer 405 may also be positioned to excite the first modes of oscillation in the first surface. In some examples, the first surface transducer 403 and third surface transducer 405 are positioned at opposite ends of the first surface 401. This positioning allows the first surface transducer 403 and second surface transducer 404 to produce a stereo output acoustic signal from the first surface 401.

In embodiments as previously described, the first and second surface transducers 403 and 404 are placed on different surfaces of the audio device 400. In these examples, the materials of the different surfaces may be optimized for the different desired frequency responses. For example, the second surface 402 of the audio device 400, on which the second surface transducer 404 is coupled to excite lower frequency vibrations, may be made of a more flexible material than the first surface 401. This more flexible material may therefore allow for higher amplitude oscillations of the fundamental mode of oscillation, thereby allowing for louder reproductions of lower frequencies.

Figure 5:
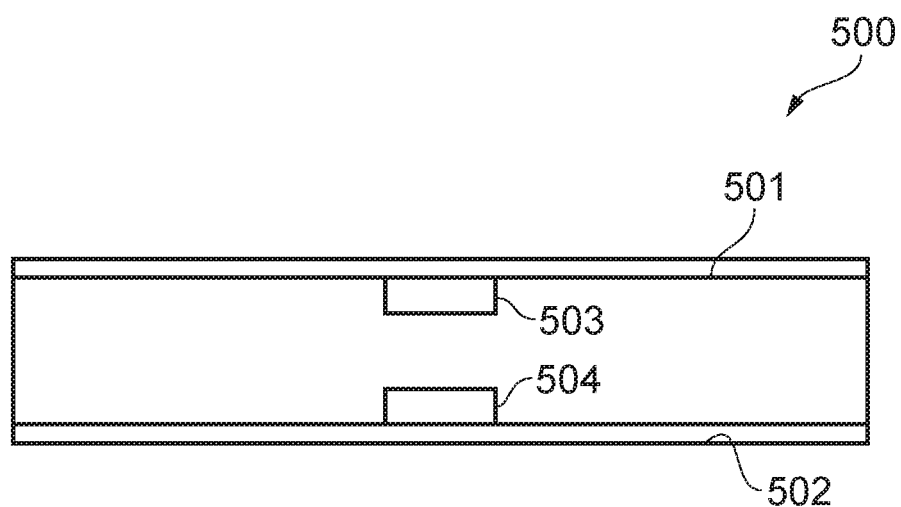
FIG. 5 is a side view of an audio device in accordance with embodiments of the present disclosure.

FIG. 5 illustrates an example of an audio device according to some embodiments of the present disclosure. The audio device 500 comprises a first surface 501 and a second surface 502. In this example, the audio device 500 comprises first surface transducer 503 configured to excite high frequency oscillations in the first surface 501 and a second surface transducer 504 configured to excite low frequency oscillations in the second surface 502. The first and second surface transducers may be located at any position on the first and second surfaces respectively. However, as described previously, it will be appreciated that the first surface transducer 503 may be located in a position to excite high frequency modes of oscillation in the first surface 501. The second surface transducer 504 may also be positioned to excite low frequency modes of oscillation in the second surface 502.

In this example, the first surface 501 and second surface 502 may be designed such that their frequency responses are appropriate for the frequencies that the first surface transducer 503 and second surface transducer 504 are configured to excite in each surface. In other words, the first surface 501 may be designed such that the frequency response of the first surface 501 is high in a higher frequency region whereas the second surface 502 may be designed such that its frequency response is high in a lower frequency region. These responses may be achieved by using different materials or thicknesses of the first and second surfaces.

It will be appreciated that other numbers of surface transducers may be used in the embodiments illustrated in FIGS. 4 and 5. For example, FIG. 4 illustrates a system having two high frequency surface transducers and one low frequency surface transducer. In the traditional nomenclature of multichannel audio systems, such a system may be referred to as a 2.1 audio system with 2 higher frequency channels forming a stereo pair, and 1 mono bass channel, in a manner similar to the 5.1 and 7.1 audio systems used in home theatre systems with 5 or 7 higher frequency channels and 1 low frequency subwoofer channel. In general, any suitable number of surface transducers allocated to different frequency ranges may be utilized. For example, there may be one surface transducer positioned at the anti-node of the fundamental configured to excite low frequency modes of oscillation, two more surface transducers configured to excite medium frequency modes of oscillation, and two further surface transducers configured to excite high frequency modes of oscillation to form a 4.1 system. All of these surface transducers may then be positioned on the relevant surface in a location suitable to generate the appropriate frequency response.

In some examples, the audio device 400 of FIG. 4 or audio device 500 of FIG. 5 may comprise audio processing circuitry configured to receive an input audio signal and process the input audio signal to input higher frequencies of the input audio signal into the first surface transducer and lower frequencies of the input audio signal into the second surface transducer. For example, the audio processing circuitry may comprise a processing module 600 as illustrated in FIG. 6.

Figure 6:
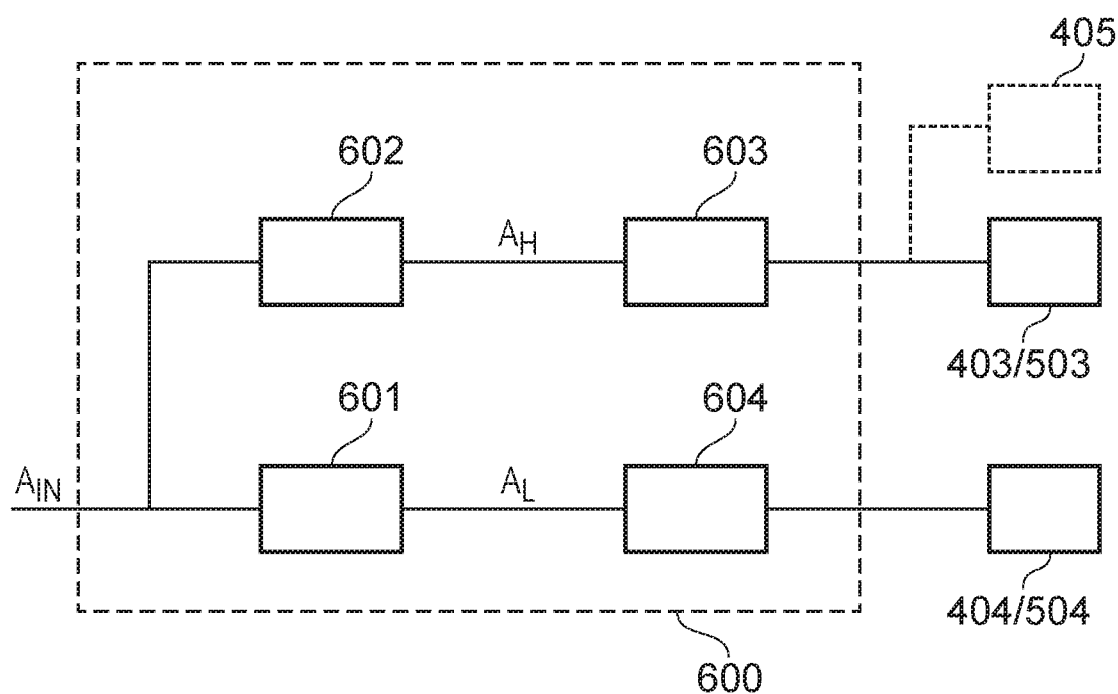
FIG. 6 illustrates a processing module in accordance with embodiments of the present disclosure.

FIG. 6 illustrates a processing module 600 for processing an audio input signal $A_{IN}$ for input into surface transducers of an audio device, such as audio device 400 or 500.

The processing module comprises a first filter block 601 for receiving the audio input signal $A_{IN}$ and outputting a signal $A_L$ comprising lower frequencies of the audio input signal $A_{IN}$. The processing module further comprises a second filter block 602 for receiving the audio input signal and outputting a signal $A_H$ comprising higher frequencies of the audio input signal $A_{IN}$. For example, the signal $A_L$ may comprise frequencies between 50 Hz and 500 Hz. The signal $A_H$ may comprise frequencies between 500 Hz and 20 kHz.

The signal $A_H$ may be input into the first surface transducer 403/503 for outputting the higher frequencies of the input audio signal. The signal $A_L$ may be input into the second surface transducer 404/504 for outputting the lower frequencies of the input audio signal $A_{IN}$. In some examples, the signal $A_H$ may be also input into the third surface transducer 405. In some examples, the higher frequencies of the input audio signal may be input in stereo to the first surface transducer 403 and the third surface transducer 405.

In some examples, the signal $A_H$ may be amplified by a first amplification block 603 before inputting into the first surface transducer 403/503. In some examples, the first amplification block may comprise amplification circuitry which is optimized for amplification of higher frequencies. For example, the first amplification block 603 may comprise a low voltage but high current class D amplifier.

In some examples, the signal $A_L$ may be amplified by a second amplification block 604 before inputting into the second surface transducer 404/504. In some examples, the second amplification block may comprise amplification circuitry which is optimized for amplification of lower frequencies. For example, the second amplification block 604 may comprise a high voltage class AB amplifier or class H linear amplifier.

This amplification may be particularly useful where the first surface transducer 403/503 and/or second surface transducer 404/504 comprises a piezo actuator. Piezo actuators present a highly capacitive load to an amplifier. For low frequencies, an amplifier may be required to drive the piezo actuator at a high voltage but with little current. Conversely, for high frequencies, an amplifier may be required to drive the piezo actuator at low voltages but with a high current. Therefore, by splitting the signal into higher frequencies and lower frequencies, the respective amplification blocks 603 and 604 may be optimized for driving the different piezo actuators according to the frequency bands of the respective signals that they are inputting into the piezo actuators.

Furthermore, the first surface transducer may itself be optimized for the reproduction of higher frequencies, and the second surface transducer may itself be optimized for the reproduction of lower frequencies. The second surface transducer may be a piezo transducer while the first surface transducer may be a voice-coil transducer. Piezo transducers may be considered very efficient at lower frequencies, but their capacitive nature means that high currents are needed to maintain their drive at higher frequencies. These high currents may lead to increased losses in support components (amplifiers, wiring for example). At higher frequencies, less excursion of the surface is required to maintain the same sound levels; therefore a more conventional moving coil or moving magnet transducers (which may have a higher impedance at higher frequencies) may be used, again minimizing losses in supporting components.

There is also provided a method of operating an audio device comprising at least one surface. The method comprises exciting first modes of oscillation in a first surface of the at least one surface, and exciting second modes of oscillation in a second surface of the at least one surface, wherein the first modes of oscillation are of a higher frequency than the second modes of oscillation.

There is therefore provided an audio device and a method of operating the audio device, wherein the audio device comprises at least one surface and two surface transducers configured to excite high frequency oscillations and low frequency oscillations in the at least one surface of the audio device.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope. Terms such as amplify or gain include possible applying a scaling factor or less than unity to a signal.

It should be understood that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems are not intended to be construed as critical, required, or essential feature or element.

Further embodiments likewise, with the benefit of this disclosure, will be apparent to those having ordinary skill in the art, and such embodiments should be deemed as being encompassed herein.

The invention claimed is:

1. An audio device comprising:
   at least one surface,
   a first surface transducer positioned to excite first modes of oscillation in a first surface of the at least one surface, and
   a second surface transducer positioned to excite second modes of oscillation in the first surface of the at least one surface, wherein the first modes of oscillation are of a higher order than the second modes of oscillation;
   wherein the second surface transducer is located at an anti-node of a fundamental mode of oscillation of the first surface.

2. The audio device as claimed in claim 1, wherein the second surface transducer is positioned a maximum distance from a fixed boundary of the first surface.

3. The audio device as claimed in claim 1, wherein the first surface transducer is positioned close to a fixed boundary of the first surface.

4. The audio device as claimed in claim 3, wherein the first surface transducer is positioned at an anti-node of a high order mode of oscillation of the first surface.

5. The audio device as claimed in claim 1, further comprising audio processing circuitry configured to:
   receive an input audio signal; and
   process the input audio signal to input higher frequencies of the input audio signal into the first surface transducer and lower frequencies of the input audio signal into the second surface transducer.

6. The audio device as claimed in claim 1, wherein the first surface transducer is optimized for reproduction of higher frequencies.

7. The audio device as claimed in claim 1, wherein the second surface transducer is optimized for reproduction of lower frequencies.

8. The audio device as claimed in claim 1, further comprising a third surface transducer positioned to excite the first modes of oscillation in the first surface.

9. The audio device as claimed in claim 8, wherein the first surface transducer is positioned at one end of the one of the first surface and the third surface transducer is positioned at an opposite end of the first surface.

10. The audio device as claimed in claim 1, wherein the audio device comprises a smartphone.

11. The audio device as claimed in claim 10, wherein the first surface comprises a screen of the audio device.

* * * * *